(12) United States Patent
Amano et al.

(10) Patent No.: US 7,947,415 B2
(45) Date of Patent: May 24, 2011

(54) REFLECTIVE MASK BLANK, REFLECTIVE MASK, METHOD OF INSPECTING REFLECTIVE MASK, AND METHOD FOR MANUFACTURING THE SAME

(75) Inventors: Tsuyoshi Amano, Ibaraki (JP); Hiroyuki Shigemura, Ibaraki (JP)

(73) Assignees: Dai Nippon Printing Co., Ltd., Tokyo-to (JP); NEC Electronics Corporation, Kanagawa (JP)

( * ) Notice: Subject to any disclaimer, the term of this patent is extended or adjusted under 35 U.S.C. 154(b) by 92 days.

(21) Appl. No.: 12/395,800

(22) Filed: Mar. 2, 2009

(65) Prior Publication Data
US 2009/0233188 A1 Sep. 17, 2009

(30) Foreign Application Priority Data
Mar. 11, 2008 (JP) ................. 2008-061765

(51) Int. Cl.
*G03F 1/00* (2006.01)
(52) U.S. Cl. ........................................................... 430/5
(58) Field of Classification Search ............. 430/5, 394; 378/35; 428/428, 430
See application file for complete search history.

(56) References Cited

U.S. PATENT DOCUMENTS

| 5,897,979 A * | 4/1999 | Tzu et al. ........................ 430/5 |
| 6,841,399 B2 * | 1/2005 | Hasegawa et al. ................ 438/4 |
| 2005/0238922 A1 | 10/2005 | Kinoshita et al. |
| 2006/0240335 A1 | 10/2006 | Mitsui |
| 2010/0167187 A1 * | 7/2010 | Ikuta et al. ........................ 430/5 |

FOREIGN PATENT DOCUMENTS

| JP | 2000-077306 A | 3/2000 |
| JP | 2005-011914 A | 1/2005 |
| JP | 2005-210093 A | 8/2005 |
| JP | 2006-267595 A | 10/2006 |

* cited by examiner

*Primary Examiner* — Stephen Rosasco
(74) *Attorney, Agent, or Firm* — Ladas & Parry LLP

(57) ABSTRACT

A main object of the invention is to provide a reflective mask for EUV lithography, which may detect an alignment mark by transmission. The invention achieves the object by providing a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, and in an alignment region where the alignment mark is provided, the other side of the substrate is exposed.

8 Claims, 3 Drawing Sheets

REFLECTIVE MASK BLANK, REFLECTIVE MASK, METHOD OF INSPECTING REFLECTIVE MASK, AND METHOD FOR MANUFACTURING THE SAME

BACKGROUND OF THE INVENTION

1. Field of the Invention

The present invention relates to a reflective mask used in extreme ultra violet (EUV) lithography.

2. Description of the Related Art

An inspection process wherein the accurate formation of a circuit pattern is inspected is usually conducted in a method for manufacturing a reflective mask for EUV lithography. In this inspection process, the accurate formation of a circuit pattern is inspected by irradiating a reflective mask with inspection light and detecting reflected light from the reflective mask. In the inspection process, defects may be easily detected when the ratio (contrast) of the reflectance of an absorber to the reflectance of a layer below the absorber (for example, a multilayer, a capping layer, or a buffer layer) is high.

In the inspection process, positional alignment between a reflective mask and an inspection apparatus is usually conducted for inspecting a circuit pattern. In the reflective mask, therefore, an alignment mark is usually formed in addition to a circuit pattern.

In EUV lithography, a conductive layer is usually formed on one side of a substrate opposite to the side of the substrate on which a circuit pattern and an alignment mark are formed, in order to hold the reflective mask on an electrostatic chuck of an exposure apparatus. In this conductive layer, a light-shielding material such as chromium is generally used, and the conductive layer is formed on the whole surface of the substrate. Accordingly, the surface of the reflective mask on which a circuit pattern and an alignment mark are formed should be irradiated with alignment light at the time of positional alignment, to detect reflected light from the alignment mark of the reflective mask.

However, in general, the alignment mark is relatively small so that the contrast maybe lowered, or depending on the wavelength of alignment light, the contrast may be significantly lowered, and thus there is a problem of difficulty in positional alignment.

Although not directed to the positional alignment between a reflective mask and an inspection apparatus in inspecting a circuit pattern of the reflective mask, a following method of positional alignment between a reflective mask and an exposure apparatus in EUV lithography has been proposed: a reflective mask having an alignment mark and a conductive layer formed on one side of a substrate opposite to the side on which a circuit pattern is formed is irradiated with alignment light, and reflected light from the alignment mark is detected (see, for example, Japanese Patent Application Laid-Open (JP-A) 2005-11914). However, the method described in JP-A 2005-11914 is a method of detecting an alignment mark formed on one side of a substrate, and even if this method is applied to positional alignment between a reflective mask and an inspection apparatus in inspecting a circuit pattern of the reflective mask, the positional relationship between the surface of the substrate and the alignment mark on the other side of the substrate may not be said to be accurate, thus making the alignment difficult.

Although directed neither to EUV lithography nor to the positional alignment between a reflective mask and an inspection apparatus in inspecting a circuit pattern of the reflective mask, a following method of alignment between a reflective mask and an exposure apparatus in X-ray projection exposure has been proposed: a reflective mask in which an alignment mark consisting of a light-shielding portion and a light-transmitting portion is formed on a region other than where an absorber pattern is formed such as in the periphery of the reflective mask is used to detect the alignment mark by transmission (see, for example, JP-A 2000-77306). However, the method described in JP-A 2000-77306 is not directed to EUV lithography, and when a conductive layer is formed on one side of the substrate opposite to the side on which a circuit pattern is formed, the alignment mark may not be detected by transmission.

SUMMARY OF THE INVENTION

To solve the problems described above, it is conceivable that when an alignment mark in a reflective mask for EUV lithography is to be detected by reflection, the wavelength of alignment light be that which makes contrast sufficiently high. In this case, however, alteration in the optical system of an inspection apparatus is necessary and not easy.

Accordingly, there is demand for a reflective mask for EUV lithography, in which an alignment mark may be detected by transmission.

To achieve the object described above, the present invention provides a reflective mask blank comprising a substrate, a multilayer formed on one side of the substrate, an intermediate layer formed on the multilayer, an absorptive layer formed on the intermediate layer, and a conductive layer formed on the other side of the substrate, wherein in an alignment region where an alignment mark is provided on a reflective mask produced from the reflective mask blank, the absorptive layer is formed directly on the substrate, and the other side of the substrate is exposed.

According to the present invention, since an absorptive layer is formed directly on a substrate and the other side of the substrate is exposed in an alignment region, a multilayer, an intermediate layer and a conductive layer are not formed in the alignment region. Hence, when a reflective mask is prepared from the reflective mask blank of the present invention, it is possible to obtain a reflective mask capable of detecting an alignment mark by transmission. In such a reflective mask, an alignment mark may be detected with good contrast, and highly accurate positional arrangement is feasible in inspecting a circuit pattern of the reflective mask or in correcting a circuit pattern of the reflective mask.

The present invention also provides a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, and in an alignment region where the alignment mark is provided, the other side of the substrate is exposed.

According to the present invention, since the other side of the substrate is exposed in the alignment region and the conductive layer is not formed in the alignment region, the alignment mark may be detected by transmission.

In the present invention, it is preferable that the alignment mark is constituted of the absorber and an opening, and the opening of the alignment mark is formed directly on the substrate. By so doing, the contrast for detection of the alignment mark may be improved.

In the above case, it is preferable that the absorber constituting the alignment mark is formed on the intermediate layer.

By so doing, the contrast for detection of the alignment mark may be further improved. Further, the reflective mask of such structure can be obtained by forming an absorber in pattern on a substrate on which a multilayer and an intermediate layer are formed, and then locally removing only the multilayer and the intermediate layer positioned on the opening of the alignment mark, and thereby easily overcome difficulty in positional arrangement.

In the above case, the absorber constituting the alignment mark may be formed directly on the substrate. In this case, the reflective mask can be obtained by using the reflective mask blank described above, and thereby easily overcome difficulty in positional arrangement.

In the present invention, the alignment mark maybe formed on the intermediate layer. In this case, the reflective mask can be obtained by processing a part of the conductive layer, and thereby easily overcome difficulty in positional arrangement.

The present invention also provides a method of inspecting the reflective mask, used in inspecting the circuit pattern of the reflective mask described above, comprising steps of: irradiating an alignment mark of the reflective mask with alignment light, detecting transmitted light transmitted through the alignment mark, and arranging the position of the reflective mask, in order to examine a circuit pattern of the reflective mask.

According to the present invention, the reflective mask described above is used, and thus the alignment mark may be detected with good contrast, and positional arrangement may be conducted accurately and rapidly.

Further, the present invention provides a method for manufacturing a reflective mask, comprising a step of inspecting a reflective mask by the above-described method of inspecting a reflective mask.

According to the present invention, the method of inspecting a reflective mask described above is applied, and thus the position of the alignment mark may be detected highly accurately in inspecting a circuit pattern of the reflective mask in the inspection process, and the positional arrangement of the reflective mask may be conducted accurately and rapidly.

According to the present invention, there is brought about an effect by which an alignment mark may be detected with good contrast by transmission, and highly accurate positional arrangement is feasible in inspecting a circuit pattern of a reflective mask and in correcting a circuit pattern of a reflective mask.

DESCRIPTION OF THE PREFERRED EMBODIMENT

Hereinafter, the reflective mask blank, the reflective mask, the method of inspecting a reflective mask, and the method for manufacturing a reflective mask according to the present invention will be described in detail.

A. Reflective Mask Blank

The reflective mask blank of the present invention is a reflective mask blank comprising a substrate, a multilayer formed on one side of the substrate, an intermediate layer formed on the multilayer, an absorptive layer formed on the intermediate layer, and a conductive layer formed on the other side of the substrate, wherein in an alignment region where an alignment mark is provided on a reflective mask produced from the reflective mask blank, the absorptive layer is formed directly on the substrate, and the other side of the substrate is exposed.

The reflective mask blank of the present invention will be described by reference to the drawings.

Figure 1A:
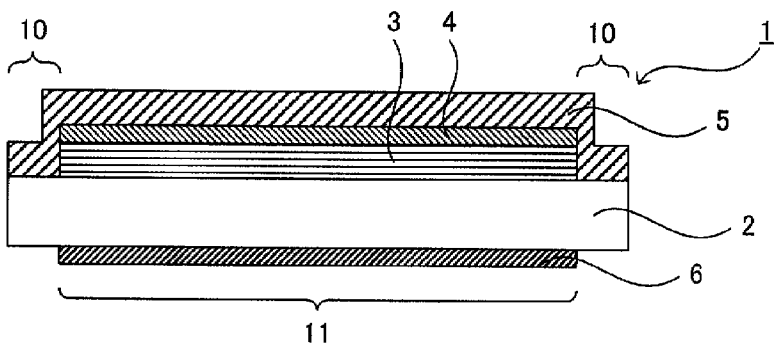
FIGS. 1A and 1B are a schematic view showing one example of the reflective mask blank of the present invention.
Figure 1B:
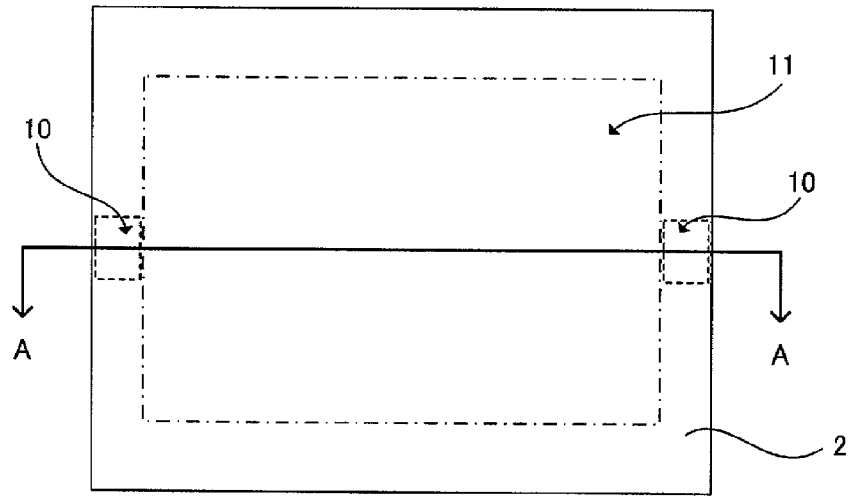

FIGS. 1A and 1B are a schematic view showing one example of the reflective mask blank of the present invention, wherein FIG. 1A is a cross-sectional view as taken on A-A line in FIG. 1B. In the reflective mask blank 1 as illustrated in FIG. 1A, a multilayer 3 and an intermediate layer 4 are laminated in this order in a predetermined region on substrate 2, and an absorptive layer 5 is formed on the whole surface of the substrate 2 so as to cover the multilayer 3 and intermediate layer 4, while a conductive layer 6 is formed in a predetermined region on the opposite side of the substrate 2 to the side on which the multilayer 3, the intermediate layer 4 and the absorptive layer 5 are formed.

When the reflective mask blank 1 is used to manufacture a reflective mask, an alignment mark for arranging the position of the reflective mask is formed on the periphery of the substrate in order to inspect a circuit pattern (the circuit pattern is obtained by patterning the absorptive layer 5). When the region where this alignment mark is to be provided is made an alignment region, the periphery of the substrate 2 is provided with an alignment region 10 where the alignment mark is to be provided, as shown in FIGS. 1A and 1B for example. The reflective mask blank of the present invention is characterized in that in the alignment region 10, the absorptive layer 5 is formed directly on the substrate 2, and the side of the substrate 2 on which the conductive layer 6 is formed is exposed. That is, the reflective mask blank is characterized in that the multilayer 3, the intermediate layer 4 and the conductive layer 6 are not formed in the alignment region 10.

In FIGS. 1A and 1B, the region where the multilayer 3, the intermediate layer 4 and the conductive layer 6 are formed is a region 11, and in FIG. 1B, the structure other than the substrate is omitted herein.

Figure 2:
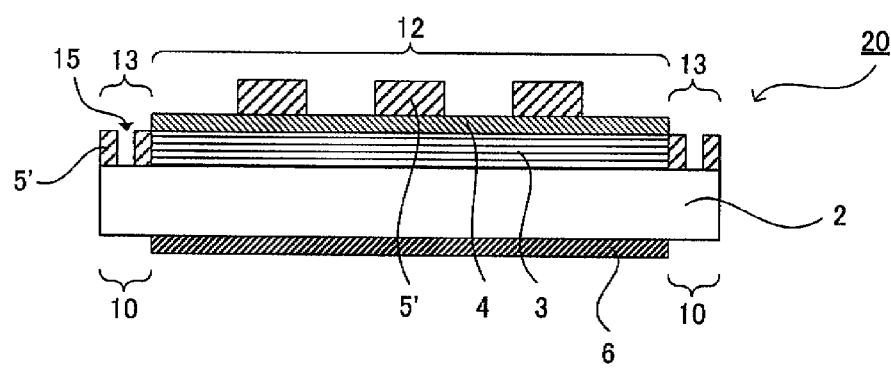
FIG. 2 is a schematic cross-sectional view showing one example of the reflective mask of the present invention.

One example of a reflective mask manufactured from the reflective mask blank illustrated in FIGS. 1A and 1B is shown in FIG. 2. In the reflective mask 20 illustrated in FIG. 2, a multilayer 3 and an intermediate layer 4 are laminated in this order in a predetermined region on a substrate 2, an absorber 5' is formed in pattern on the substrate 2 on which the multilayer 3 and the intermediate layer 4 are formed, and a conductive layer 6 is formed in a predetermined region on the opposite side of the substrate 2 to the side on which the multilayer 3, the intermediate layer 4 and the absorber 5' are formed. The pattern of the absorber 5' constitutes a circuit pattern 12 and alignment mark 13, and in an alignment region 10 where the alignment mark 13 is provided, the absorber 5' is formed directly on the substrate 2, and the side of the substrate 2 on which the conductive layer 6 are formed is exposed in the alignment region 10. That is, the multilayer 3, the intermediate layer 4 and the conductive layer 6 are not formed in the alignment region 10.

In the reflective mask illustrated in FIG. 2, since the side of the substrate on which the conductive layer is formed is exposed in the alignment region, and the conductive layer is not formed in the alignment region, the alignment mark may be detected by transmission.

Figure 3:
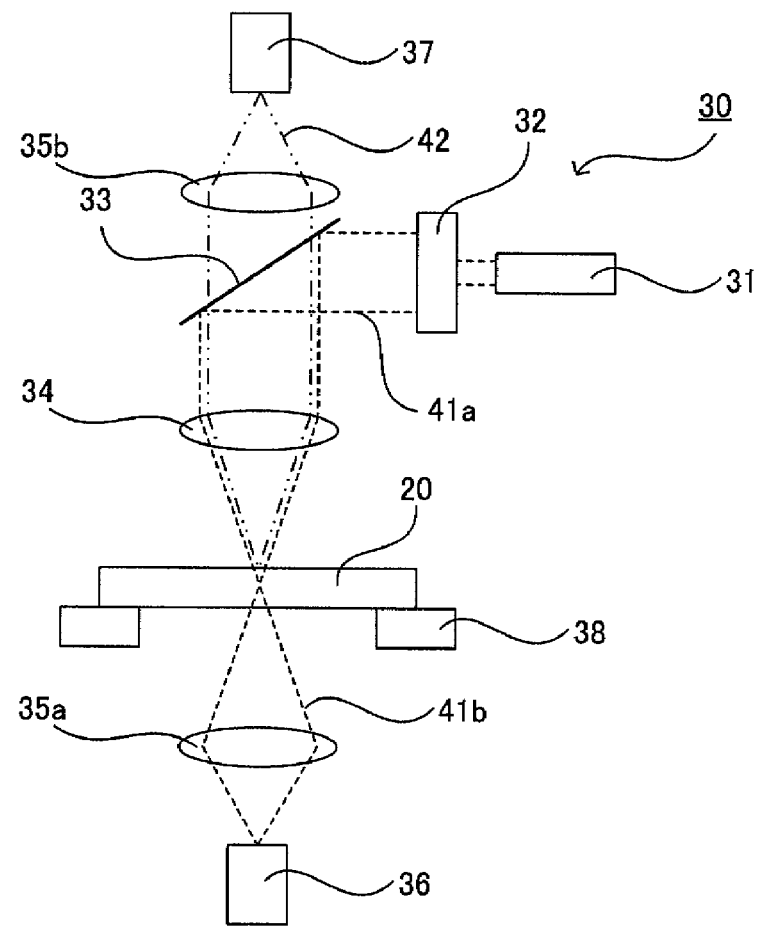
FIG. 3 is a schematic view showing one example of the transmissive mask alignment mechanism used in the method of inspecting a reflective mask according to the present invention.

FIG. 3 shows one example of a transmissive mask alignment mechanism. The transmissive mask alignment mechanism 30 illustrated in FIG. 3 comprises an optical source 31, a collecting optical system 32, a beam splitter 33, an objective lens 34, a collecting lens 35a, a transmitted light inspection sensor 36, a reflected light inspection sensor 37, and a mask stage 38. In the transmissive mask alignment mechanism 30, alignment light 41a emitted from the light source 31 is applied to an alignment mark (not shown) of a reflective mask 20, and its transmitted light 41b is detected by the transmitted light inspection sensor 36.

In the reflective mask illustrated in FIG. 2, an opening 15 of the alignment mark is formed directly on the substrate 2. In FIG. 3, therefore, alignment light 41a can pass through an opening (not shown) of the alignment mark, to enable positional arrangement by the transmissive mask alignment mechanism.

In FIG. 3, the reflected light inspection sensor 37 and the collecting lens 35b are used in inspecting a circuit pattern of a reflective mask, and are specifically used in detecting reflected light 42 by irradiating the circuit pattern of the reflective mask 20 with inspection light emitted from the light source 31.

By using the reflective mask blank of the present invention in this manner, a reflective mask capable of detecting an alignment mark by transmission may be obtained. In such a reflective mask, the alignment mark may be detected with good contrast, and highly accurate positional arrangement is feasible in inspecting a circuit pattern of the reflective mask and in correcting a circuit pattern of the reflective mask.

In this specification, the "absorptive layer" means one layer formed continuously on a substrate, and the "absorber" means a body formed on a predetermined position on the substrate and obtained by patterning the absorptive layer.

The phrase "in the alignment region, the absorptive layer is formed directly on the substrate, and the other side of the substrate is exposed" means that the multilayer, the intermediate layer and the conductive layer are not formed in the alignment region.

Unless otherwise stated, "one side of the substrate" means the side of the substrate on which the multilayer, the intermediate layer and the absorptive layer (absorber) are formed, and "the other side of the substrate" means the side of the substrate on which the conductive layer is formed.

Hereinafter, the respective constitutions of the reflective mask blank of the present invention will be described.

1. Conductive Layer

The conductive layer used in the present invention is formed on the other side of the substrate, that is, on the opposite side of the substrate to the side on which the multilayer, the intermediate layer and the absorptive layer are formed, and the conductive layer is not formed in the alignment region. This conductive layer is disposed for attaching a reflective mask manufactured from the reflective mask blank of the present invention, to an electrostatic chuck of an exposure apparatus.

The material of the conductive layer is not particularly limited as long as it is generally used in a conductive layer of a reflective mask. For example, electrically conductive metals or metal compounds such as Cr, CrN are used.

The thickness of the conductive layer may be for example about 50 nm to 150 nm.

The conductive layer must not be formed in the alignment region, and the region where the conductive layer is provided may be the same as, or different from, the region where the multilayer and the intermediate layer are provided.

The method of forming the conductive layer includes sputtering etc. The method of forming the conductive layer on a region other than the alignment region includes sputtering or photolithography via a physical mask placed in a region where the film is not to be formed.

2. Multilayer

The multilayer used in the present invention is formed on one side of the substrate and is not formed in the alignment region.

The material of the multilayer may be one which may be used generally in a multilayer of a reflective mask, and particularly a material having very high reflectance to EUV light is preferably used. This is because contrast may be increased when the reflective mask is used. For example, Mo/Si periodic multilayer is generally used as the multilayer that reflects EUV light. Ru/Si periodic multilayer, Mo/Be periodic multilayer, Mo compound/Si compound periodic multilayer, Si/Nb periodic multilayer, Si/Mo/Ru periodic multilayer, Si/Mo/Ru/Mo periodic multilayer, Si/Ru/Mo/Ru periodic multilayer, etc. may also be used as multilayers having high reflectance in a specific wavelength region.

The thickness of each of layers constituting the multilayer, and the number of the layers, vary depending on the material used and is appropriately adjusted. For example, the Mo/Si periodic multilayer may be a multilayer wherein 40 to 60 Mo and Si films each having thickness of few nm are alternately stacked.

The thickness of the multilayer may be for example about 280 nm to 420 nm.

The multilayer must not be formed in the alignment region. As described above, the region where the multilayer is provided may be the same as, or different from, the region where the conductive layer is provided.

For example, ion beam sputtering or magnetron sputtering is used as the method of forming the multilayer. The method of forming the multilayer on a region other than the alignment region includes vapor deposition or photolithography via a physical mask placed in a region where the film is not to be formed.

3. Intermediate Layer

The intermediate layer used in the present invention is formed on the multilayer but is not formed in the alignment region.

The layer constituting the intermediate layer includes, for example, a capping layer disposed to prevent oxidation of the multilayer or for protection in mask washing conducted in manufacturing a reflective mask from the reflective mask blank of the present invention, and a buffer layer (also called an etching stopper layer) disposed for preventing damage of the multilayer in pattern etching of the absorptive layer by method such as dry etching, or in correcting defects of a circuit pattern.

The intermediate layer may be a capping layer, a buffer layer, or a laminate of a capping layer and a buffer layer. Particularly, the intermediate layer comprises preferably at least a capping layer. That is, the intermediate layer is preferably either a capping layer or a laminate of a capping layer and a buffer layer.

In the laminate of a capping layer and a buffer layer, the capping layer and the buffer layer are usually formed in this order on the multilayer.

Hereinafter, the capping layer and buffer layer will be described respectively.

(1) Capping Layer

The capping layer used in the present invention is a layer constituting the intermediate layer and is provided on the multilayer in order to prevent oxidation of the multilayer or to protect the reflection mask during washing. When the outermost surface of the multilayer is an Si or Ru film, oxidization of the Si or Ru film can be prevented by forming the capping layer. When the Si or Ru film is oxidized, the reflectance of the multilayer may be decreased.

The material of the capping layer, although not particularly limited as long as it exhibits the above function, includes, for example, Si or Ru.

The thickness of the capping layer maybe for example about 2 nm to 15 nm.

The method of forming the capping layer includes sputtering etc. The method of forming the capping layer on a region other than the alignment region includes sputtering or photolithography via a physical mask placed in a region where the layer is not to be formed.

(2) Buffer Layer

The buffer layer used in the present invention is a layer constituting the intermediate layer and is provided for preventing damages of the multilayer therebelow in pattern etching, by a method such as dry etching, of an absorptive layer absorbing EUV light used in EUV exposure, or in correcting defects of a circuit pattern. Because the buffer layer is formed, the multilayer can be prevented from undergoing damage from etching upon patterning the absorptive layer or upon correcting defects of a circuit pattern.

Although the material of the buffer layer is not particularly limited as long as it is highly resistant to etching, a material that differs in an etching characteristic from that of the absorptive layer, that is, a material that differs in etching selectivity from that of the absorptive layer, is used. The difference in etching selectivity between the buffer layer and the absorptive layer is preferably 5 or more, more preferably 10 or more, even more preferably 20 or more. The material of the buffer layer is preferably a material of low stress and excellent in smoothness. Particularly the smoothness of the buffer layer is preferably 0.3 nm Rms or less. From this viewpoint, the material of the buffer layer is preferably in a fine crystal structure or an amorphous structure.

The material of the buffer layer includes, for example, $SiO_2$, $Al_2O_3$, Cr or CrN.

The thickness of such buffer layer may be for example about 2 nm to 15 nm.

The method of forming the buffer layer includes, for example, magnetron sputtering or ion beam sputtering. When $SiO_2$ is used, it is preferable that an $SiO_2$ target is used in an Ar gas atmosphere by RF magnetron sputtering to form a film of $SiO_2$ on the multilayer. The method of forming the buffer layer on a region other than the alignment region, it is possible to use vapor deposition or photolithography via a physical mask placed in a region where the layer is not to be formed.

4. Alignment Region

The alignment region in the present invention is a region where an alignment mark is provided in a reflective mask manufactured from the reflective mask blank of the present invention.

The alignment region may be provided in one site or in two or more sites on the reflective mask blank. In FIG. 1B for example, the alignment region 10 is provided in two sites.

Usually, the alignment region is provided in the periphery of the reflective mask blank as illustrated in FIG. 1B.

5. Absorptive Layer

The absorptive layer used in the present invention is formed on the intermediate layer, and absorbs EUV light in EUV lithography with a reflective mask manufactured from the reflective mask blank of the present invention.

The material of the absorptive layer is not particularly limited as long as it may absorb EUV light. For example, Ta, TaN, a material consisting primary of Ta, Cr, and a material consisting primary of Cr and containing at least one component selected from N, O and C may be used. Besides, materials such as TaSi, TaSiN, TaGe, TaGeN, WN, and TiN may also be used.

The method used in forming the absorptive layer includes, for example, magnetron sputtering, ion beam sputtering, CVD, and vapor deposition.

6. Substrate

The substrate used in the present invention is not particularly limited as long as it transmits alignment light used in positional arrangement for inspecting a circuit pattern with a reflective mask manufactured from the reflective mask blank of the present invention. A substrate used generally in a reflective mask may be used, and for example, a glass substrate and a metal substrate may be used. Particularly, a glass substrate is preferably used. The glass substrate has excellent smoothness and flatness and is thus preferable particularly as a substrate for reflective mask. Examples of the glass substrate include quartz glass, amorphous glass having low thermal expansion coefficient (for example $SiO_2$—$TiO_2$ glass), and crystallized glass resulting from precipitation of β-quartz solid solutions. The material of metal substrates includes, for example, silicon and Fe—Ni inver alloys.

To attain high reflectance and transfer accuracy, the substrate has preferably a smoothness of 0.2 nm Rms or less and a flatness of 100 nm or less. The unit "Rms" indicative of smoothness is root-mean-square roughness which may be measured with an atomic force microscope. The flatness is a value indicative of surface warpage (deformation) indicated by TIR (Total Indicated Reading). This value, when a plane determined based on the surface of a substrate by the least-squares method is a focal plane, is the absolute value of a difference in elevation between the highest position of the surface of the substrate above the focal plane and the lowest position below the focal plane. The smoothness is smoothness in a 10-μm square area, and the flatness is flatness in a 142-mm square area.

The thickness of the substrate may be for example about 6 mm to 7 mm.

7. Use

The reflective mask blank of the present invention is used preferably in manufacturing a reflective mask for EUV lithography.

B. Reflective Mask

Next, the reflective mask of the present invention is described in detail.

The reflective mask of the present invention is a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, and in an alignment region where the alignment mark is provided, the other side of the substrate is exposed.

According to the present invention, the side of the substrate on which the conductive layer is formed is exposed in the alignment region, and the conductive layer is not formed in the alignment region. Thus, the absorber constituting the alignment mark shields alignment light, while the opening of the alignment mark transmits alignment light, so the alignment mark can be detected by the transmissive mask alignment mechanism.

The phrase "the other side of the substrate is exposed in the alignment region" means that the conductive layer is not formed in the alignment region.

The reflective mask of the present invention may be divided into 2 embodiments, depending on the structure between the opening of the alignment mark and the substrate. The first embodiment is a case of a reflective mask wherein the opening of the alignment mark is formed directly on the substrate, that is, a reflective mask wherein the multilayer and the intermediate layer are not formed between the opening of the alignment mark and the substrate. The second embodiment is a case of a reflective mask wherein the alignment mark is formed on the intermediate layer, that is, a reflective mask wherein the multilayer and the intermediate layer are formed between the alignment mark and the substrate.

Hereinafter, the embodiments will be described respectively.

1. First Embodiment

The reflective mask in the first embodiment of the invention is a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, the other side of the substrate is exposed in an alignment region where the alignment mark is provided, the alignment mark is constituted of the absorber and an opening, and the opening of the alignment mark is formed directly on the substrate.

According to this embodiment, the side of the substrate on which the conductive layer is formed is exposed in the alignment region, the conductive layer is not formed in the alignment region, the opening of the alignment mark is formed directly on the substrate, and the multilayer and the intermediate layer are not formed between the opening of the alignment mark and the substrate, and thus the absorber constituting the alignment mark shields alignment light, while the opening of the alignment mark transmits alignment light, thereby enabling detection of the alignment mark with high contrast by the transmissive mask alignment mechanism. Accordingly, highly accurate and rapid positional arrangement is feasible.

The reflective mask in this embodiment may be further divided into two aspects, depending on the structure between the absorber constituting the alignment mark and the substrate. The first aspect is a case of a reflective mask wherein the absorber constituting the alignment mark is formed on the intermediate layer, that is, a reflective mask wherein the multilayer and the intermediate layer are formed between the absorber constituting the alignment mark and the substrate. The second aspect is a reflective mask wherein the absorber constituting the alignment mark is formed directly on the substrate, that is, a reflective mask wherein the multilayer and the intermediate layer are not formed between the absorber constituting the alignment mark and the substrate.

Hereinafter, these aspects will be described respectively.

The phrase "the opening of the alignment mark is formed directly on the substrate" means that the multilayer and the intermediate layer are not formed between the opening of the alignment and the substrate.

The phrase "the absorber constituting the alignment mark is formed on the intermediate layer" means that the multilayer and the intermediate layer are formed between the absorber constituting the alignment and the substrate. The phrase "the absorber constituting the alignment mark is formed directly on the substrate" means that the multilayer and the intermediate layer are not formed between the absorber constituting the alignment and the substrate.

(1) First Aspect

The reflective mask in this aspect is a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, the other side of the substrate is exposed in an alignment region where the alignment mark is provided, the alignment mark is constituted of the absorber and an opening, the opening of the alignment mark is formed directly on the substrate, and the absorber constituting the alignment mark is formed on the intermediate layer.

The reflective mask in this aspect will be described by reference to the drawings.

Figure 4:
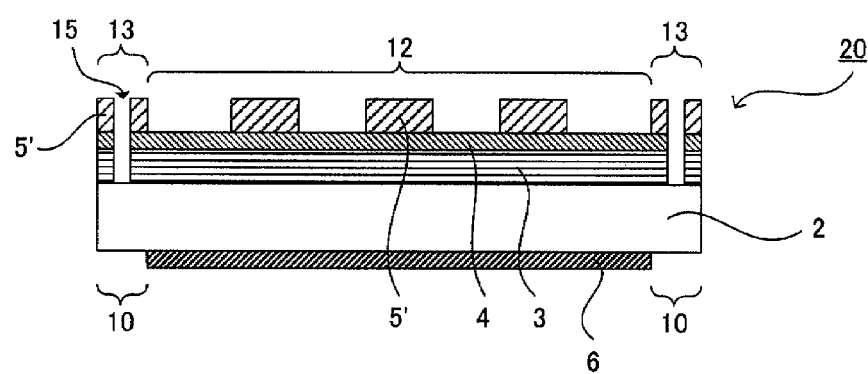
FIG. 4 is a schematic cross-sectional view showing another example of the reflective mask of the present invention.

FIG. 4 is a schematic cross-sectional view showing one example of the reflective mask in this aspect. In the reflective mask 20 illustrated in FIG. 4, a multilayer 3 and an intermediate layer 4 are laminated in this order in a predetermined region on a substrate 2, an absorber 5' is formed in pattern on the intermediate layer 4, and a conductive layer 6 is formed in a predetermined region on the opposite side of the substrate 2 to the side on which the multilayer 3, the intermediate layer 4 and the absorber 5' are formed. The pattern of the absorber 5' constitutes a circuit pattern 12 and an alignment mark 13, and the side of the substrate 2 on which the conductive layer 6 is formed is exposed in the alignment region 10 where the alignment mark 13 is provided. That is, the conductive layer 6 is not formed in the alignment region 10. The alignment mark 13 is constituted of the absorber 5' and an opening 15, and the opening 15 of the alignment mark is formed directly on the substrate 2. That is, the multilayer 3 and the intermediate layer 4 are not formed between the opening 15 of the alignment mark and the substrate 2. Also, the absorber 5' constituting the alignment mark 13 is formed on the intermediate layer 4. That is, the multilayer 3 and the intermediate layer 4 are formed between the absorber 5' constituting the alignment mark 13 and the substrate 2.

According to this aspect, the side of the substrate on which the conductive layer is formed is exposed in the alignment region, and the conductive layer is not formed in the alignment region, and thus the alignment mark can be detected by transmission.

For overcoming difficulty in arranging the position of the reflective mask, the reflective mask alignment mechanism should be modified or algorism should be altered in order to apply the reflective mask alignment mechanism. By processing the reflective mask in this aspect, positional arrangement is feasible in the transmissive mask alignment mechanism, and thus difficulty in positional arrangement can be easily overcome. In this aspect, the multilayer, the intermediate layer, and a part of the conductive layer in the reflective mask may be simply processed in the method for manufacturing the reflective mask such that the alignment mark can be read by transmission.

According to this aspect, the opening of the alignment mark is formed directly on the substrate, and the multilayer and the intermediate layer are not formed between the opening of the alignment mark and the substrate, and therefore, the ratio (contrast) of the transmittance of the substrate located on the opening of the alignment mark to the transmittance of the absorber constituting the alignment mark, the multilayer and the intermediate layer can be increased.

In the present invention, the reflective mask in this aspect is most preferable. This is because the contrast may further be improved as described above, and further because the reflective mask in this aspect may be obtained by forming an absorber in pattern on a substrate having a multilayer and an intermediate layer formed thereon, and then locally etching only the multilayer and the intermediate layer positioned on the opening of an alignment mark, and may easily overcome difficulty in positional arrangement.

The substrate, the conductive layer and the alignment region are the same as described in "A. Reflective Mask Blank", and thus their description is omitted herein. Hereinafter, other constitutions of the reflective mask in this aspect will be described.

(i) Absorber

The absorber in this aspect is formed in pattern on a substrate having a multilayer and an intermediate layer formed thereon, and is provided on the intermediate layer. Not only the absorber constituting a circuit pattern but also the absorber constituting an alignment mark is provided on the intermediate layer.

The material of the absorber, film thickness etc. are the same as the material of the absorptive layer, film thickness etc. described in "A. Reflective Mask Blank", and thus their description is omitted herein.

Usually, photolithography is used as the method of forming the absorber in pattern. Specifically, an absorptive layer is formed on a substrate on which a multilayer and an intermediate layer are formed, then a resist layer is formed on this absorptive layer, the resist layer is patterned, the absorptive layer is etched with the resist pattern as a mask, and the remaining resist pattern is removed, whereby a pattern of the absorber is formed. A general method may be used as the photolithography.

The pattern of the absorber constitutes a circuit pattern and an alignment mark. Hereinafter, the circuit pattern and the alignment mark will be described in detail.

(Circuit Pattern)

The circuit pattern in this aspect is a pattern for transfer to a transfer surface.

The pattern shape of the circuit pattern is suitably selected depending on a member to be manufactured by EUV lithography using the reflective mask in this aspect.

(Alignment Mark)

The alignment mark in this aspect is provided for arrangement of the position of the reflective mask in inspecting or correcting a circuit pattern.

The alignment mark is constituted of an absorber and an opening, and a multilayer and an intermediate layer are not formed between the opening of the alignment mark and the substrate, and a multilayer and an intermediate layer are formed between the absorber constituting the alignment mark and the substrate.

The pattern shape of the alignment mark may be a general shape such as cross.

(ii) Multilayer

The multilayer in this aspect is formed on one side of the substrate, is not formed between the opening of the alignment mark and the substrate, and is formed between the absorber constituting the alignment mark and the substrate.

The material of the multilayer, film thickness etc. are the same as the material of the multilayer, film thickness etc. described in "A. Reflective Mask Blank", and thus their description is omitted herein.

The method of removing the portion of the multilayer that is positioned in the opening of the alignment mark is not particularly limited as long as this portion only can be locally removed, and particularly an etching method is preferable. The etching method may be a dry or wet etching method, preferably a dry etching method.

Energy beam used in the dry etching method is not particularly limited as long as only the portion of the multilayer that is positioned in the opening of the alignment mark can be locally etched. Preferably, focused ion beam or electron beam is used. This is because these beams enable advanced microfabrication and may cope with fine portions.

The ion source of the focused ion beam may be one which may be focused, and usually gallium (Ga) is used.

(iii) Intermediate Layer

The intermediate layer in this aspect is formed on the multilayer, is not formed between the opening of the alignment mark and the substrate, and is formed between the absorber constituting the alignment mark and the substrate.

The structure of the intermediate layer is the same as that of the intermediate layer described above in "A. Reflective Mask Blank", and thus its description is omitted herein.

The method of removing the portion of the intermediate layer that is positioned in the opening of the alignment mark may be the same as in the method of removing of the portion of the multilayer that is positioned in the opening of the alignment mark.

(2) Second Aspect

The reflective mask in this aspect is a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, and in an alignment region where the alignment mark is provided, the other side of the substrate is exposed, the alignment mark is constituted of the absorber and an opening, the opening of the alignment mark is formed directly on the substrate, and the absorber constituting the alignment mark is also formed directly on the substrate.

The reflective mask in this aspect will be described with reference to the drawings.

FIG. 2 is a schematic cross-sectional view showing one example of the reflective mask in this aspect. In the reflective mask 20 illustrated in FIG. 2, a multilayer 3 and an intermediate layer 4 are laminated in this order in a predetermined region on a substrate 2, an absorber 5' is formed in pattern on the substrate 2 on which the multilayer 3 and the intermediate layer 4 are formed, and a conductive layer 6 is formed in a predetermined region on the opposite side of the substrate 2 to the side on which the multilayer 3, the intermediate layer 4 and the absorber 5' are formed. The pattern of the absorber 5' constitutes a circuit pattern 12 and an alignment mark 13, and in the alignment region 10 on which the alignment mark 13 is provided, the side of the substrate 2 on which the conductive layer 6 is formed is exposed. That is, the conductive layer 6 is not formed in the alignment region 10. The alignment mark 13 is constituted of the absorber 5' and an opening 15, and the opening 15 of the alignment mark is formed directly on the substrate 2. That is, the interlayer film 3 and the intermediate layer 4 are not formed between the opening 15 of the alignment mark and the substrate 2. Also, the absorber 5' constituting the alignment mark is formed directly on the substrate 2. That is, the multilayer 3 and the intermediate layer 4 are not formed between the absorber 5' constituting the alignment mark 13 and the substrate 2.

According to this aspect, since the side of the substrate on which the conductive layer is formed is exposed in the alignment region, and the conductive layer is not formed in the alignment region, the alignment mark can be detected by transmission.

In this aspect, positional arrangement in the transmissive mask alignment mechanism is made feasible by processing the reflective mask, and therefore, difficulty in positional arrangement may be easily overcome. The multilayer, the intermediate layer, and a part of the conductive layer in the reflective mask can be simply processed in the method for manufacturing the reflective mask such that the alignment mark can be read by transmission.

According to this aspect, the opening of the alignment mark is formed directly on the substrate, and the multilayer and the intermediate layer are not formed between the opening of the alignment mark and the substrate, and therefore, the ratio (contrast) of the transmittance of the substrate located on the opening of the alignment mark to the transmittance of the absorber constituting the alignment mark, the multilayer and the intermediate layer can be increased.

The reflective mask in this aspect can be obtained by patterning the absorptive layer using the reflective mask blank described above in "A. Reflective Mask Blank".

The substrate, the conductive layer and the alignment region are the same as described above in "A. Reflective Mask Blank", and thus their description is omitted herein. Hereinafter, other constitutions of the reflective mask in this aspect are described.

(i) Absorber

The absorber in this aspect is formed in pattern on a substrate having a multilayer and an intermediate layer formed thereon, and is provided on the intermediate layer and on the substrate. The absorber constituting a circuit pattern is provided on the intermediate layer, while the absorber constituting an alignment mark is provided on the substrate.

The material, film thickness etc. of the absorber are the same as the material, film thickness etc. of the absorptive layer described above in "A. Reflective Mask Blank", and thus their description is omitted herein.

The method of forming the absorber in pattern is the same as in the first aspect, and thus its description is omitted herein.

The pattern of the absorber constitutes a circuit pattern and an alignment mark.

The circuit pattern is the same as in the first aspect, and thus its description is omitted herein.

In this aspect, the alignment mark is formed directly on the substrate. The alignment mark is constituted of an absorber and an opening, and the multilayer and the intermediate layer are not formed between the opening of the alignment mark and the substrate, and the multilayer and the intermediate layer are also not formed between the absorber constituting the alignment mark and the substrate.

Other features of the alignment mark are the same as described in the first aspect, and thus their description is omitted herein.

(ii) Multilayer

The multilayer in this aspect is formed on one side of the substrate and is formed neither between the opening of the alignment mark and the substrate, nor between the absorber constituting the alignment mark and the substrate.

Other features of the multilayer are the same as described above in the multilayer in "A. Reflective Mask Blank", and thus their description is omitted herein.

(iii) Intermediate Layer

The intermediate layer in this aspect is formed on a multilayer, and is formed neither between the opening of the alignment mark and the substrate, nor between the absorber constituting the alignment mark and the substrate.

Other features of the intermediate layer are the same as described in the intermediate layer in "A. Reflective Mask Blank", and thus their description is omitted herein.

2. Second Embodiment

The reflective mask in the second embodiment of the invention is a reflective mask comprising a substrate, a multilayer formed on one side of the substrate, an intermediate layer formed on the multilayer, an absorber formed in pattern on the substrate on which the multilayer and the intermediate layer are formed, and a conductive layer formed on the other side of the substrate, wherein the pattern of the absorber constitutes a circuit pattern and an alignment mark, and in an alignment region where the alignment mark is provided, the other side of the substrate is exposed, and the alignment mark is formed on the intermediate layer.

The reflective mask in this aspect will be described by reference to the drawings.

Figure 5:
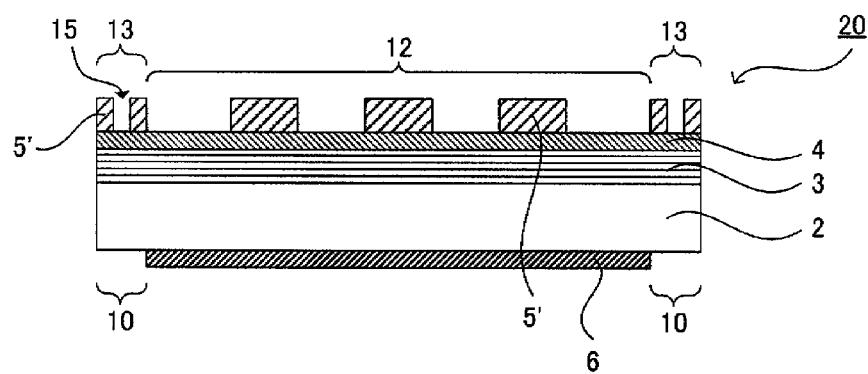
FIG. 5 is a schematic cross-sectional view showing another example of the reflective mask of the present invention.

FIG. 5 is a schematic cross-sectional view showing one example of the reflective mask in this aspect. In the reflective mask 20 illustrated in FIG. 5, a multilayer 3 and an intermediate layer 4 are laminated in this order on a substrate 2, an absorber 5' is formed in pattern on the intermediate layer 4, and a conductive layer 6 is formed in a predetermined region on the opposite side of the substrate 2 to the side on which the multilayer 3, the intermediate layer 4 and the absorber 5' are formed. The pattern of the absorber 5' constitutes a circuit pattern 12 and an alignment mark 13, and in an alignment region 10 on which the alignment mark 13 is provided, the side of the substrate 2 on which the conductive layer 6 is formed is exposed. That is, the conductive layer 6 is not formed in the alignment region 10. The alignment mark 13 is constituted of the absorber 5' and an opening 15, and the alignment mark 13 is formed on the intermediate layer 4. That is, the multilayer 3 and the intermediate layer 4 are formed among the absorber 5' constituting the alignment mark, the opening 15, and the substrate 2.

According to this aspect, since the side of the substrate on which the conductive layer is formed is exposed in the alignment region, and the conductive layer is not formed in the alignment region, the alignment mark can be detected by transmission.

In this aspect, positional arrangement in the transmissive mask alignment mechanism is made feasible by processing the reflective mask, and therefore, difficulty in positional arrangement can be easily overcome. A part of the conductive layer in the reflective mask may be simply processed in the method for manufacturing the reflective mask such that the alignment mark can be read by transmission.

The phrase "the alignment mark is formed on the intermediate layer" means that the multilayer and the intermediate layer are formed between the absorber constituting the alignment and the substrate, and the multilayer and the intermediate layer are also formed between the opening of the alignment mark and the substrate.

The substrate, the conductive layer and the alignment region are the same as described above in "A. Reflective Mask Blank", and thus their description is omitted herein. Hereinafter, other constitutions of the reflective mask in this aspect will be described in detail.

(i) Absorber

The absorber in this aspect is formed in pattern on a substrate having a multilayer and an intermediate layer formed thereon, and is provided on the intermediate layer. Both the absorber constituting a circuit pattern and the absorber constituting an alignment mark are provided on the intermediate layer.

The material, film thickness etc. of the absorber are the same as the material, film thickness etc. of the absorptive layer described in "A. Reflective Mask Blank", and thus their description is omitted herein.

The method of forming the absorber in pattern is the same as in the first embodiment, and thus its description is omitted herein.

The pattern of the absorber constitutes a circuit pattern and an alignment mark.

The circuit pattern is the same as described in the first embodiment, and thus its description is omitted herein.

In this aspect, the alignment mark is formed on the intermediate layer. The alignment mark is constituted of the absorber and the opening, and the multilayer and the intermediate layer are formed among the absorber constituting the alignment mark, the opening, and the substrate.

Other features of the alignment mark are the same as described in the first embodiment, and thus their description is omitted herein.

(ii) Multilayer

The multilayer in this aspect is formed on one side of the substrate. Usually, the multilayer is formed on the whole surface of the substrate.

The material of the multilayer, the method of manufacturing the film, etc. are the same as described in the multilayer in "A. Reflective Mask Blank", and thus their description is omitted herein.

(iii) Intermediate Layer

The intermediate layer in this aspect is formed on the multilayer. Usually, the intermediate layer is formed on the whole surface of the substrate.

The structure of the intermediate layer, etc. is the same as described in the intermediate layer in "A. Reflective Mask Blank", and thus their description is omitted herein.

C. Method of Inspecting Reflective Mask

The method of inspecting a reflective mask according to the present invention is a method of inspecting a circuit pattern of the reflective mask described above, comprising steps of: irradiating an alignment mark of the reflective mask with alignment light, detecting transmitted light that was transmitted through the alignment mark, and arranging the position of the reflective mask, in order to examine the circuit pattern of the reflective mask.

When the circuit pattern of the reflective mask is inspected, for example, an inspection apparatus having a pattern inspection unit, a transmissive mask alignment mechanism and a mask stage is used.

For example, the reflective mask is first held on the mask stage, then the alignment mark of the reflective mask is irradiated with alignment light by the transmissive mask alignment mechanism, the transmitted light from the alignment mark is detected, and the position of the reflective mask is arranged. In this case, the reflective mask in the first aspect in the first embodiment illustrated in FIG. 4 detects the contrast of the transmittance of the absorber constituting the alignment mark, the intermediate layer and the multilayer to the transmittance of the substrate located on the opening of the alignment mark. The reflective mask in the second aspect in the first embodiment illustrated in FIG. 2 detects the contrast of the transmittance of the absorber constituting the alignment mark to the transmittance of the substrate located on the opening of the alignment mark. The reflective mask in the second embodiment illustrated in FIG. 5 detects the contrast of the transmittance of the absorber constituting the alignment mark, the intermediate layer and the multilayer to the transmittance of the intermediate layer and the multilayer located on the opening of the alignment mark.

Then, the circuit pattern of the reflective mask is irradiated with inspection light by the pattern inspection unit, the reflected light from the circuit pattern is detected, and the circuit pattern is inspected. In this case, the contrast of the reflectance of the absorber constituting the circuit pattern to the reflectance of the multilayer positioned on the opening of the circuit pattern is detected as shown in FIGS. 2, 4 and 5.

According to the present invention, the reflective mask described above is used, and thus the alignment mark can be detected accurately and rapidly, thereby arranging the position accurately and rapidly.

The reflective mask was described in "B. Reflective Mask", and thus its description is omitted herein.

The alignment light is not particularly limited as long as the alignment mark can be detected by transmission. For example, ultraviolet light, visible light, infrared light etc. may be used. The alignment light is selected suitably depending in particular on the structure of the substrate of the reflective mask and the structure between the alignment mark and the substrate.

For example, when the substrate of the reflective mask is a glass substrate, since the glass substrate exhibits relatively high transmittance to visible light and attains high contrast, visible light is preferably used as the alignment light. When the substrate of the reflective mask is a silicon substrate, since the silicon substrate exhibits relatively high transmittance to infrared light, infrared light is preferably used as the alignment light.

For example, when the multilayer 3 and the intermediate layer 4 are formed between the opening 15 of the alignment mark and the substrate 2 as shown in FIG. 5, a light with relatively long wavelength is preferably used as the alignment light to attain desired contrast.

The alignment light may be applied either to the side of the substrate on which the alignment mark is formed or to the side of the substrate on which the conductive layer is formed.

The unit for detecting the transmitted light that was transmitted through the alignment mark includes, for example, CCD.

The method of inspecting a circuit pattern of the reflective mask includes a method that usually involves irradiating the circuit pattern with inspection light and detecting the reflected light from the circuit pattern.

The inspection light is not particularly limited as long as the circuit pattern can be detected by reflection. For example, electron beam, X ray, ultraviolet light and the like maybe used. Usually, a light of shorter wavelength than that of the alignment light is used.

The unit for detecting the reflected light from the circuit pattern includes, for example, CCD.

D. Method for Manufacturing Reflective Mask

The method for manufacturing a reflective mask according to the present invention comprises a step of inspecting a reflective mask by the above-described method of inspecting a reflective mask.

According to the present invention, the above-described method of inspecting a reflective mask is used, and thus the position of the alignment mark can be detected highly accurately in inspection of a circuit pattern of the reflective mask in the inspection process, thereby arranging the position of the reflective mask accurately and rapidly.

In the present invention, when the reflective mask described in "B. Reflective Mask" can be manufactured, it is possible to carry out, before the inspection process, a multilayer forming step of forming a multilayer on a substrate, an intermediate layer forming step of forming an intermediate layer on the multilayer, an absorptive layer forming step of forming an absorptive layer on the intermediate layer, an absorptive layer patterning step of patterning the absorptive layer to form a patterned absorber, a multilayer/intermediate layer patterning step of removing the multilayer and intermediate layer positioned on the opening of the alignment mark, a conductive layer forming step of forming a conductive layer on the substrate, a conductive layer patterning step of removing the conductive layer positioned in the alignment region, and the like.

A description of the respective steps is omitted herein because the method of forming each constitution was described in the reflective mask in "B. Reflective Mask".

The conductive layer patterning step may be conducted before or after the multilayer forming step, the intermediate layer forming step and the absorptive layer forming step, may be conducted after the absorptive layer patterning step, or may be conducted after the multilayer/intermediate layer patterning step.

The present invention is not limited to the embodiments described above. The embodiments described above are mere illustrative, and those having substantially the same constitution and the same working effect as in the technical idea described in the claims of the present invention are included in the technical scope of the present invention.

EXAMPLES

Hereinafter, the present invention will be described in more detail by reference to the Examples.

Example 1

FIG. 4 is a cross-sectional view showing one aspect of the reflective mask according to the present invention. In this reflective mask, a multilayer 3 is formed as a reflective part on substrate 2, an intermediate layer 4 for the purpose of protecting the multilayer and of assisting pattern formation is formed on the multilayer 3, and a circuit pattern 12 as a non-reflective part, and an absorber 5' constituting an alignment mark 13, are formed on the intermediate layer 4. On the other side of the substrate 2, a conductive layer 6 is formed in a region other than the alignment mark. In FIG. 4, the intermediate layer and the multilayer were removed from the portion of the opening 15 of the alignment mark by dry etching via FIB or EB system or via a resist process. The alignment mark was thereby composed of the absorber formed on the intermediate layer and the opening formed directly on the substrate. Hereinafter, an example of mask alignment using a transmission optical system at the time of inspecting or correcting the circuit pattern will be specifically described.

After the usual EUV mask process, a semiconductor circuit pattern and an alignment mark were manufactured on the absorptive layer. The portion of the opening of the alignment mark was irradiated with FIB with Ga ion as an ion source to remove the intermediate layer and the multilayer. For inspecting defects of the semiconductor circuit pattern, the pattern was inspected with a defect inspection apparatus. After mechanical alignment operation with the inspection apparatus, highly accurate alignment operation was carried out using an optical system with a wavelength of 190 to 700 nm. The alignment mark of the reflective mask is a mark which is composed of the absorber formed on the intermediate layer and the opening formed directly on the substrate and which consists of the portion where the multilayer, the intermediate layer and the absorber are stacked on the substrate and the portion where the substrate is exposed, and thus a high contrast image having a transmission contrast of 0.8 or more was obtained as the alignment image. The alignment mark could thereby be detected by the transmission optical system, and defect inspection was feasible with the photomask and EUV mask in the same defect inspection apparatus.

Example 2

FIG. 2 is a cross-sectional view showing one aspect of the reflective mask according to the present invention. In this reflective mask, a multilayer 3 is formed as a reflective part on substrate 2, an intermediate layer 4 for the purpose of protecting the multilayer and of assisting pattern formation is formed on the multilayer 3, and an absorber 5' is formed as a non-reflective part on the intermediate layer 4. In FIG. 2, the absorber 5' is patterned to constitute a semiconductor circuit pattern and an alignment mark. On the other side of the substrate 2, a conductive layer 6 is formed in a region other than the alignment mark. In FIG. 2, the multilayer and the intermediate layer were previously removed from the portion where the alignment mark 13 is to be formed. The alignment mark was thereby composed of the absorber formed directly on the substrate and the opening formed directly on the substrate. Hereinafter, an example of mask alignment using a transmission optical system at the time of inspecting or correcting the circuit pattern will be specifically described.

A reflective mask for EUV exposure having the sectional structure in FIG. 2 was manufactured. For inspecting defects of the semiconductor circuit pattern, the pattern was inspected with a defect inspection apparatus. After mechanical alignment operation with the inspection apparatus, highly accurate alignment operation was carried out using an optical system with a wavelength of 190 to 700 nm. The alignment mark of the reflective mask is a mark which is composed of the absorber formed directly on the substrate and the opening formed directly on the substrate and which consists of the portion where the absorber is formed directly on the substrate and the portion where the substrate is exposed, and thus a high contrast image having a transmission contrast of 0.8 or more was obtained as the alignment image. The alignment mark could thereby be detected by the transmission optical system, and defect inspection was feasible with the photomask and EUV mask in the same defect inspection apparatus.

Example 3

FIG. 5 is a cross-sectional view showing one aspect of the reflective mask according to the present invention. In this reflective mask, a multilayer 3 is formed as a reflective part on substrate 2, an intermediate layer 4 for the purpose of protecting the multilayer and of assisting pattern formation is formed on the multilayer 3, and an absorber 5' is formed as a non-reflective part on the intermediate layer 4. In FIG. 5, the absorber 5' is patterned to constitute a semiconductor circuit pattern and an alignment mark. On the other side of the substrate 2, a conductive layer 6 is formed in a region other than the alignment mark. Hereinafter, an example of mask alignment using a transmission optical system at the time of inspecting or correcting the circuit pattern will be specifically described.

A reflective mask for EUV exposure having the sectional structure in FIG. 5 was manufactured. For inspecting defects of the semiconductor circuit pattern, the pattern was inspected with a defect inspection apparatus. After mechanical alignment operation with the inspection apparatus, highly accurate alignment operation was carried out using an optical system with a wavelength of 600 to 700 nm. The alignment mark of the reflective mask is a mark which is composed of the absorber formed on the intermediate layer and the opening formed on the intermediate layer and which consists of the portion where the multilayer, the intermediate layer and the absorber are stacked on the substrate and the portion where the multilayer and the intermediate layer are stacked on the substrate, and thus an image having a transmission contrast of 0.2 or more was obtained as the alignment image. The alignment mark could thereby be detected by the transmission optical system, and defect inspection was feasible with the photomask and EUV mask in the same defect inspection apparatus.

What is claimed is:

1. A reflective mask blank comprising:
   a substrate;
   a multilayer formed on one side of the substrate;
   an intermediate layer formed on the multilayer;
   an absorptive layer formed on the substrate and the intermediate layer; and
   a conductive layer formed on the other side of the substrate,
   wherein in an alignment region where an alignment mark is provided on a reflective mask produced from the reflective mask blank, the absorptive layer is formed directly on the substrate, and the other side of the substrate is exposed.

2. A reflective mask comprising:
   a substrate;
   a multilayer formed on one side of the substrate;
   an intermediate layer formed on the multilayer;
   an absorber formed in pattern on the substrate and the intermediate layer, or the intermediate layer; and
   a conductive layer formed on the other side of the substrate,
   wherein the pattern of the absorber constitutes a circuit pattern and an alignment mark, and in an alignment region where the alignment mark is provided, the other side of the substrate is exposed.

3. The reflective mask according to claim 2, wherein the alignment mark comprises the absorber and an opening, and the opening of the alignment mark is formed directly on the substrate.

4. The reflective mask according to claim 3, wherein the absorber constituting the alignment mark is formed on the intermediate layer.

5. The reflective mask according to claim 3, wherein the absorber constituting the alignment mark is formed directly on the substrate.

6. The reflective mask according to claim 2, wherein the alignment mark is formed on the intermediate layer.

7. A method of inspecting a reflective mask, used in inspecting a circuit pattern of the reflective mask claim 2, comprising:
   providing the reflective mask of claim 2;
   irradiating the alignment mark of the reflective mask with alignment light;
   detecting transmitted light transmitted through the alignment mark; and
   arranging a position of the reflective mask, in order to examine the circuit pattern of the reflective mask.

8. A method for manufacturing a reflective mask, comprising inspecting the reflective mask by the method of inspecting a reflective mask according to claim 7.

* * * * *